(12) United States Patent
Ichinose et al.

(10) Patent No.: US 9,230,909 B2
(45) Date of Patent: Jan. 5, 2016

(54) SEMICONDUCTOR DEVICE AND MANUFACTURING METHOD THEREOF, AND MOUNTING METHOD OF SEMICONDUCTOR DEVICE

(71) Applicant: Renesas Electronics Corporation, Kawasaki-shi, Kanagawa (JP)

(72) Inventors: Kazuhito Ichinose, Kanagawa (JP); Seiji Muranaka, Kanagawa (JP); Kazuyuki Omori, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/445,059

(22) Filed: Jul. 29, 2014

(65) Prior Publication Data

US 2015/0035156 A1 Feb. 5, 2015

(30) Foreign Application Priority Data

Aug. 1, 2013 (JP) .................................. 2013-160544

(51) Int. Cl.
| | |
|---|---|
| *H01L 23/522* | (2006.01) |
| *H01L 23/532* | (2006.01) |
| *H01L 21/768* | (2006.01) |
| *H01L 23/00* | (2006.01) |
| *H01L 23/525* | (2006.01) |

(52) U.S. Cl.
CPC ...... *H01L 23/5226* (2013.01); *H01L 21/76835* (2013.01); *H01L 21/76879* (2013.01); *H01L 23/522* (2013.01); *H01L 23/53223* (2013.01); *H01L 23/53238* (2013.01); *H01L 23/53295* (2013.01); *H01L 24/48* (2013.01); *H01L 24/85* (2013.01); *H01L 24/97* (2013.01); *H01L 23/525* (2013.01); *H01L 2224/04042* (2013.01); *H01L 2924/15747* (2013.01)

(58) Field of Classification Search
CPC ... H01L 23/481; H01L 23/482; H01L 23/485; H01L 23/522; H01L 23/52; H01L 23/5226; H01L 23/528; H01L 23/5283; H01L 23/5329
See application file for complete search history.

(56) References Cited

U.S. PATENT DOCUMENTS

| | | | |
|---|---|---|---|
| 5,989,992 A | 11/1999 | Yabu et al. | |
| 7,489,041 B2 * | 2/2009 | Akram | 257/778 |
| 2003/0116850 A1 * | 6/2003 | Volant et al. | 257/758 |
| 2005/0280120 A1 * | 12/2005 | Tomita | 257/620 |
| 2008/0105947 A1 * | 5/2008 | Kuzuhara et al. | 257/506 |

(Continued)

FOREIGN PATENT DOCUMENTS

| | | |
|---|---|---|
| JP | 10-092817 A | 4/1998 |
| JP | 2007-073611 A | 3/2007 |

*Primary Examiner* — Eduardo A Rodela
(74) *Attorney, Agent, or Firm* — Miles & Stockbridge P.C.

(57) ABSTRACT

Disclosed is a semiconductor device whose reliability can be improved. The semiconductor device includes: first wiring formed over a semiconductor substrate via a first insulating film; a second insulating film that includes an inorganic film covering the first wiring and that has a flat surface on which CMP processing has been performed; a third insulating film that is formed over the second insulating film and includes an inorganic film having moisture resistance higher than that of the second insulating film; and second wiring formed over the third insulating film. The thickness of the second wiring is 10 times or more larger than that of the first wiring, and the second wiring is located over the third insulating film without an organic insulating film being interposed between itself and the third insulating film.

8 Claims, 15 Drawing Sheets

(56) References Cited

U.S. PATENT DOCUMENTS

| | | | |
|---|---|---|---|
| 2009/0102059 A1* | 4/2009 | Ishii | 257/774 |
| 2010/0244199 A1* | 9/2010 | Sakuma et al. | 257/618 |
| 2012/0248609 A1* | 10/2012 | Tomita | 257/751 |
| 2013/0153888 A1* | 6/2013 | Inoue et al. | 257/43 |

* cited by examiner

SEMICONDUCTOR DEVICE AND MANUFACTURING METHOD THEREOF, AND MOUNTING METHOD OF SEMICONDUCTOR DEVICE

CROSS-REFERENCE TO RELATED APPLICATIONS

The disclosure of Japanese Patent Application No. 2013-160544 filed on Aug. 1, 2013 including the specification, drawings and abstract is incorporated herein by reference in its entirety.

BACKGROUND

The present invention relates to a semiconductor device and a manufacturing method thereof, and a mounting method of a semiconductor device, and the invention can be preferably applied to a semiconductor device including thick uppermost layer wiring containing, for example, Cu, and a manufacturing method thereof, and a mounting method of a semiconductor device.

In recent years, there is a demand for making one semiconductor chip to be compatible with various mounting configurations. For example, when external terminals arranged at small pitches for wire bonding are converted into those arranged at relatively large pitches for bump electrodes, such as WPP, thick rewiring (rewiring layer, uppermost layer wiring) containing Cu is used over the top surface of a semiconductor chip.

This rewiring layer is also used in other applications besides the aforementioned one in which the pitches of external terminals are converted, and, for example, in Japanese Unexamined Patent Application Publication No. 2007-73611 (Patent Document 1), a technique is disclosed, in which passive elements and wiring coupled thereto are formed over a semiconductor wafer (substrate) by using rewiring. Specifically, a three-layer insulating film including a silicon oxide film, a silicon nitride film, and a polyimide resin film, is formed so as to cover lower layer wiring containing aluminum (Al) that is formed over a substrate. The lower layer wiring has a pad part at the bottom of an opening formed in the three-layer insulating film, and one end of the rewiring containing Cu is coupled to the pad part, while the other end extends over the three-layer insulating film to be coupled to a bump electrode. In order to reduce the stress applied to the bump electrode, the thickness of the polyimide film, formed over a laminated structure including the silicon oxide film and the silicon nitride film, is relatively larger than that of the laminated structure.

Also, in Japanese Unexamined Patent Application Publication No. 1998-92817 (Patent Document 2), it is disclosed that an embedded insulating film having a low dielectric constant and a passivation film having a high dielectric constant and high moisture absorption resistance are sequentially deposited and a surface protective film for the wiring is formed by a composite film of the above two films. It is also disclosed that: a TEOS film deposited by a plasma CVD method is used as the embedded insulating film having a low dielectric constant and a silicon nitride film deposited by a plasma CVD method is used as the passivation film; and the TEOS film is flattened by performing CMP processing before the deposition of the silicon nitride film. In Patent Document 2, it is described that: in a passivation film, it is not necessary to take into consideration poor coverage of a stepped portion, occurrence of a pinhole or a crack, an increase in local stress, or the like; and hence the thickness of the passivation film can be set to a requisite minimum. That is, the flattening of the TEOS film by CMP processing is performed to make the thickness of the passivation film formed thereover to be small.

The present inventors are studying how to improve the operation speed of a semiconductor device by using a rewiring layer as wiring. According to the study by the inventors, it has been revealed that a high-density arrangement of a rewiring layer is difficult in a structure in which a polyimide resin film is provided under rewiring, as described in Patent Document 1. It has also been revealed that, if a structure in which a polyimide resin film, is simply omitted is adopted, a crack is generated in an insulating film under a rewiring layer, and hence the reliability of a semiconductor device is decreased in terms of moisture resistance, etc.

Other problems and new features will become clear from the description and accompanying drawings of the present specification.

A semiconductor device according to an embodiment includes: first wiring formed over a semiconductor substrate via a first insulating film; a second insulating film that includes an inorganic film covering the first wiring and that has a flat upper surface on which CMP processing has been performed; a third insulating film that is formed over the second insulating film and includes an inorganic film having moisture resistance higher than that of the second insulating film; and second wiring formed over the third insulating film. The thickness of the second wiring is 10 times or more larger than that of the first wiring, and the second wiring is located over the third insulating film without an organic insulating film being interposed between itself and the third insulating film.

According to the embodiment, the reliability of a semiconductor device can be improved.

DETAILED DESCRIPTION

Figure 1:
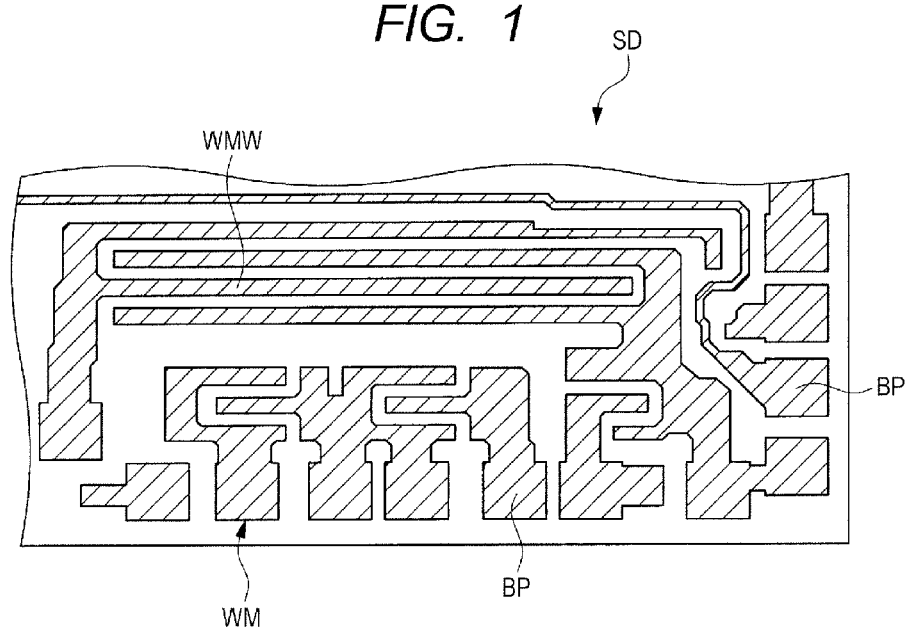
FIG. 1 is a plan view of a substantial part of a semiconductor device of an embodiment.

Hereinafter, preferred embodiments will be described in detail based on the drawings. In each view for describing the embodiments, components having the same function will be denoted with the same reference numeral, and duplicative description thereof will be omitted. In the following embodiments, description of the same or similar parts will not be repeated in principle, unless particularly necessary.

In the drawings used in the embodiments, hatching may be omitted even in sectional views in order to make them easier to see. Alternatively, hatching may be added even in plan views in order to make them easier to see.

(First Embodiment)

A semiconductor device of the present embodiment will be described with reference to the accompanying drawings. FIG. 1 is a plan view of a substantial part of a semiconductor device of the embodiment. FIG. 1 illustrates a plane pattern of a rewiring layer that is uppermost layer wiring of a semiconductor device (semiconductor chip), and illustrates a plane pattern of only a portion at a corner of the semiconductor device.

As illustrated in FIG. 1, a rewiring layer (rewiring) WM has both a bonding pad BP portion having a rectangular shape and wiring WMW portion extending from the bonding pad BP. The bonding pad BP is arranged along an end portion of a semiconductor device SD, and the wiring WMW portion extends toward the inside of the semiconductor device SD from the bonding pad BP. The later-described MISFET (Metal Insulator Semiconductor Field Effect Transistor), which is not illustrated, is formed in the semiconductor device SD, and one end of the wiring WMW portion is electrically coupled to the MISFET. The other end of the wiring WMW portion is coupled to the bonding pad BP to be integrated therewith. The later-described bonding wire, which is not illustrated, is electrically coupled to the bonding pad BP.

Figure 2:
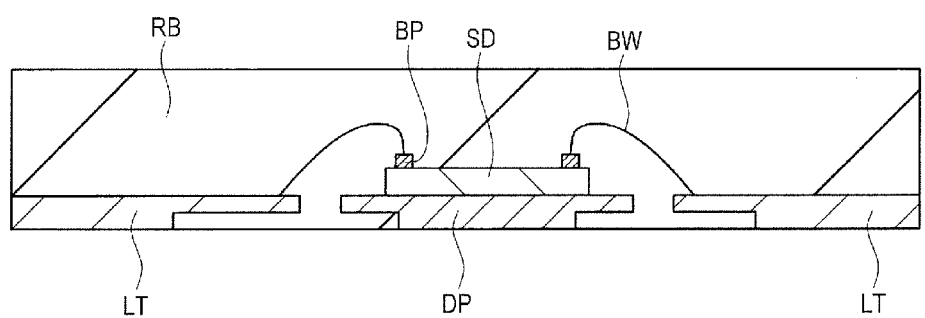
FIG. 2 is a sectional view illustrating an entire structure of the semiconductor device of the embodiment.

FIG. 2 is a sectional view illustrating an entire structure of the semiconductor device SD of the present embodiment. The semiconductor device SD is mounted over a die pad DP including a Cu lead frame, and a plurality of lead terminals LT each including a Cu lead frame are radially arranged around the die pad DP. The bonding pad BP in the semiconductor device SD and the lead terminal LT are electrically coupled together by a bonding wire BW containing Cu. The semiconductor device SD, the bonding wire BW, the die pad DP, and the lead terminals LT are sealed by a sealing body RB containing an epoxy resin. The entire structure of the semiconductor device SD including the semiconductor device SD, the bonding wire BW, the die pad DP, the lead terminals LT, and the sealing body RB is referred to as a sealed type semiconductor device, but a sealed type semiconductor device may be simply referred to as a semiconductor device SD. The sealed type semiconductor device has a rectangular shape, and over the bottom thereof, a portion of each of the lead terminals LT and a portion of the die pad DP are exposed from the sealing body RB. The lead terminals LT are also exposed from the sealing body RB over a side surface of the sealed type semiconductor device SD.

Figure 3:
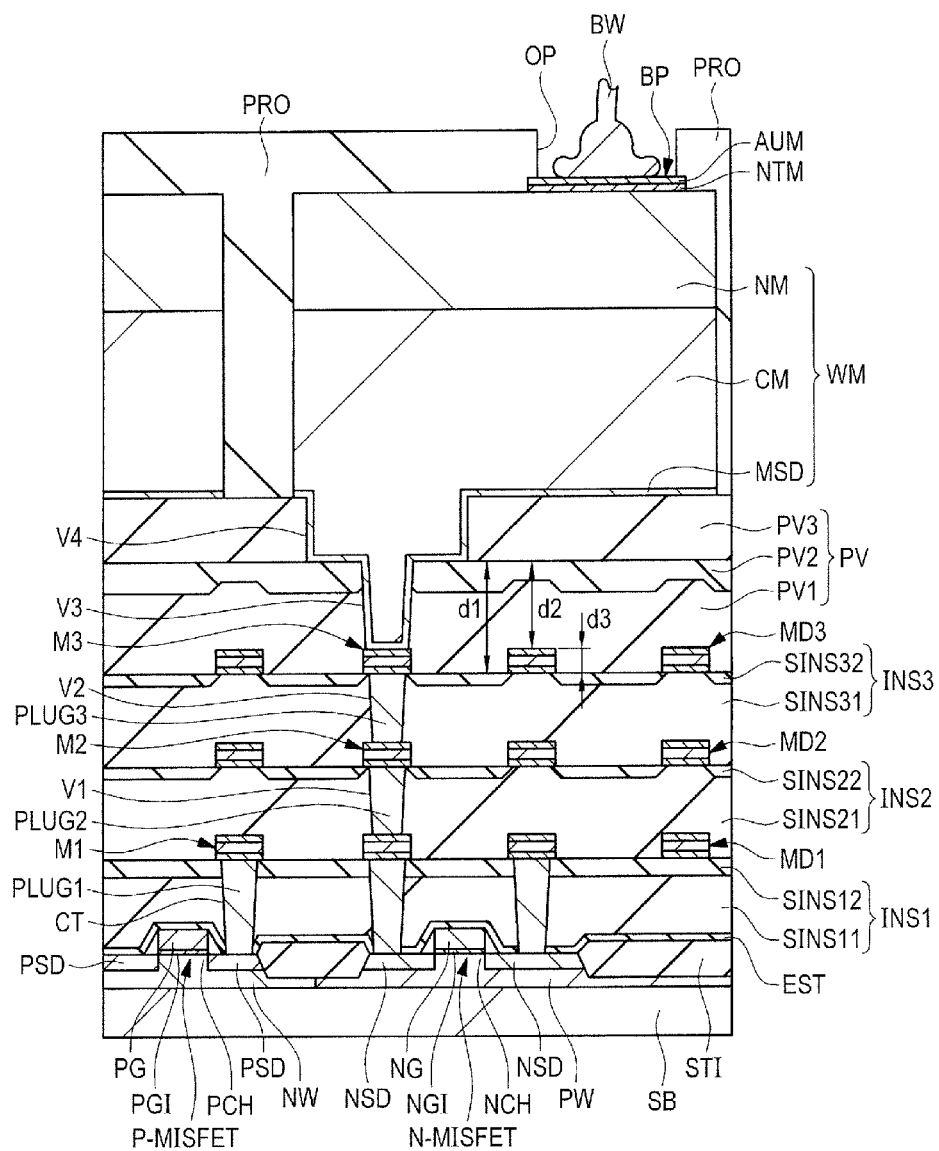
FIG. 3 is a sectional view of a substantial part of the semiconductor device of the embodiment.

FIG. 3 is a sectional view of a substantial part of the semiconductor device SD of the present embodiment. A plurality of p-type well regions PW and a plurality of n-type well regions NW are formed over a major surface (top surface) of a p-type semiconductor substrate SB containing silicon, and an n-type MISFET is formed in the p-type well region PW and a p-type MISFET is formed in the n-type well region NW. An element isolation film (element isolation region) STI including an insulating film, such as a silicon oxide film, is partially formed over the top surface of the semiconductor substrate SB. In the p-type well region PW and the n-type well region NW, the element isolation film STI defines an n-type MISFET formation region and a p-type MISFET formation region. That is, one or more n-type MISFETs are formed in a region in the p-type well region PW, the region being surrounded, when planarly viewed, by the element isolation film STI. Also, one or more p-type MISFETs are formed in a region in the n-type well region NW, the region being surrounded, when planarly viewed, by the element isolation film STI. The n-type MISFET includes: an n-type source region NSD and an n-type drain region NSD that contact the element isolation film STI; a channel formation region NCH between the source region NSD and the drain region NSD; and a gate electrode NG formed over the channel formation region NCH via a gate insulating film NGI. The p-type MISFET includes: a p-type source region PSD and a p-type drain region PSD that contact the element isolation film STI; a channel formation region PCH between the source region PSD and the drain region PSD; and a gate electrode PG formed over the channel formation region PCH via a gate insulating film PGI.

The n-type MISFET, the p-type MISFET, and the element isolation film STI are covered with an etching stopper film EST including a silicon nitride film. A first interlayer insulating film INS1 is further formed over the etching stopper film EST, the first interlayer insulating film INS1 including a laminated structure of a sub interlayer insulating film SINS11 and a sub interlayer insulating film SINS12. The sub interlayer insulating film SINS11 includes a BP (Boron, Phosphorus)-TEOS film formed over the etching stopper film EST, while the sub interlayer insulating film SINS12 includes a P—SiO film formed over the sub interlayer insulating film SINS11 by a plasma CVD method. A plurality of contact holes CT are formed in the sub interlayer insulating film SINS12, the sub interlayer insulating film SINS11, and the etching stopper film EST, and each of the contact holes CT is filled up with a first plug electrode PLUG1 having a tungsten film. The first plug electrode PLUG1 is electrically coupled, for example, to the source region NSD and the drain region NSD in the n-type MISFET and to the source region PSD in the p-type MISFET. In opening the contact hole CT, cutting of the semiconductor substrate SB, possibly occurring when the contact hole CT is formed, can be reduced by performing etching on the etching stopper film EST at an etching selection ratio larger than those on the sub interlayer insulating film SINS11 and the sub interlayer insulating film SINS12.

A plurality of first wiring M1 are formed over the first interlayer insulating film INS1. The first wiring M1 is aluminum (Al) wiring containing copper (Cu), and has both a laminated film of titanium (Ti) and titanium nitride (TiN) under the Al wiring and TiN over the Al wiring. That is, the first wiring M1 has a laminated structure including, from its lowest layer, Ti, TiN, Al wiring containing Cu, and TiN.

Incidentally, the thickness of the first wiring M1 is approximately 400 nm to 500 nm, and that of the Al wiring containing Cu is approximately 350 nm to 450 nm. The first wiring M1 is located over the first plug electrode PLUG1 to be electrically coupled thereto.

Herein, the first wiring M1 has a plurality of first dummy wiring MD1. The first dummy wiring MD1 are not coupled to the first plug electrode PLUG1 and are electrically floating. The respective first dummy wiring MD1 are arranged in a matrix pattern having predetermined pitches equal to each other, in a region where the first wiring M1 is not present. Each of the first dummy wiring MD1 has a rectangular shape, when planarly viewed.

A second interlayer insulating film INS2 is formed so as to cover the first wiring M1 and the first dummy wiring MD1. The second interlayer insulating film INS2 includes a laminated structure of a sub interlayer insulating film SINS21 and a sub interlayer insulating film SINS22. The lower layer sub interlayer insulating film SINS21 is a silicon oxide film, namely, a USG (Undope Silicate Glass) film (HDP-USG) formed by a High Density Plasma CVD method having a good step-covering performance, while the upper layer sub interlayer insulating film SINS22 is a TEOS film (P-TEOS) formed by a plasma CVD method. The second interlayer insulating film INS2 has a flat surface flattened by CMP processing. A plurality of first via holes V1 are formed in the second interlayer insulating film INS2, and the first via hole V1 is filled up with a second plug electrode PLUG2 having a tungsten film. The second plug electrode PLUG2 is electrically coupled to the first wiring M1.

A plurality of second wiring M2 are formed over the second interlayer insulating film INS2. The second wiring M2 includes the same members and the same structure as those of the first wiring M1, and is electrically coupled thereto via the second plug electrode PLUG2. Second dummy wiring MD2, which is the same as the first dummy wiring MD1, is formed over the second interlayer insulating film INS2.

A third interlayer insulating film INS3 is formed so as to cover the second wiring M2 and the second dummy wiring MD2. The third interlayer insulating film INS3 includes a laminated structure of a sub interlayer insulating film SINS31 and a sub interlayer insulating film SINS32. The third interlayer insulating film INS3 has the same configuration as that of the second interlayer insulating film INS2, and has a flat surface on which CMP processing has been performed. A plurality of second via holes V2 are formed in the third interlayer insulating film INS3, and the second via hole V2 is filled up with a third plug electrode PLUG3 having a tungsten film. The third plug electrode PLUG3 is electrically coupled to the second wiring M2.

A plurality of third wiring M3 are formed over the third interlayer insulating film INS3. The third wiring M3 includes the same members and the same structure as those of the second wiring M2, and is electrically coupled thereto via the third plug electrode PLUG3. Third dummy wiring MD3, having the same structure as that of the second dummy wiring MD2, is formed over the third interlayer insulating film INS3.

A passivation film PV is formed so as to cover the third wiring M3 and the third dummy wiring MD3. This passivation film PV includes a laminated structure having, from its lowest layer, a first passivation film PV1, a second passivation film PV2, and a third passivation film PV3, each of which includes an inorganic insulating film. The first passivation film PV1 is an HDP-USG film, while the second passivation film PV2 is a film (P-TEOS) formed by a plasma CVD method. A laminated film of the first passivation film PV1 and the second passivation film PV2 has a flat surface on which CMP processing has been performed, and the total thickness of the laminated film (t1) is set to be 900 nm$\leq t_1 \leq$3000 nm. Herein, it is assumed that: the thickness of the laminated film of the first passivation film PV1 and the second passivation film PV2 between two of the third wiring M3 is d1; the thickness of the laminated film thereof over the third wiring M3 is d2; and the thickness of the third wiring M3 is d3. Because the third interlayer insulating film INS3 has a flat surface, d1 is almost equal to the total of d2 and d3, thereby (d1≅d2+d3) is satisfied. Herein, "almost equal" means that the following equation: (d2+d3−d1≤d3×20%) is satisfied.

The third passivation film PV3, which includes a silicon nitride film having a thickness of 600 nm to 2000 nm, is formed over the surface of the laminated film of the first passivation film PV1 and the second passivation film PV2, the surface being flattened by performing CMP processing thereon, as described above. The silicon nitride film has compressive stress within a range of 500 MPa to 1 GPa and a coefficient of linear expansion of approximately $3 \times 10^{-6}$/K. The compressive stress means that the semiconductor substrate SB is applied with the compressive stress by the silicon nitride film. A third via hole V3 is formed in the laminated film of the first passivation film PV1 and the second passivation film PV2, while a fourth via hole V4 is formed in the third passivation film PV3. A rewiring layer WM is formed in the third via hole V3, in the fourth via hole V4, and directly on the passivation film PV including inorganic insulating films. That is, an organic insulating film is not interposed between the rewiring layer WM and the passivation film PV including inorganic insulating films. The rewiring layer WM includes a laminated structure of a plating seed film MSD, a Cu plated film CM, and a Ni plated film NM. Herein, the plating seed film MSD includes a laminated film of a chromium (Cr) film and a Cu film, each of which has been formed by a sputtering method, and the thickness of the laminated film is 400 to 500 nm. The Cu plated film CM is a Cu film formed by a plating method and having a thickness of approximately 8 μm, while the Ni plated film NM is a Ni film formed by a plating method and having a thickness of approximately 4 μm. The Ni plated film NM is formed to prevent oxidization of the Cu plated film CM. Because the thickness of the rewiring layer WM is approximately 12.5 μm and that of the third wiring M3 is approximately 500 nm, it can be said that the rewiring layer WM is wiring of low resistance having a thickness 10 times or more larger than that of the third wiring M3.

A laminated film of a Ni plated thin film NTM formed by a plating method and an Au plated film AUM formed by a plating method is partially formed over the Ni plated film NM. A protective film PRO including, for example, a polyimide film, is further formed so as to cover the upper surface of the passivation film PV, the upper surface and the side surface of the rewiring layer WM, and the upper surface and the side surface of the laminated film of the Ni plated thin film NTM and the Au plated film AUM. An opening OP for exposing part of the Au plated film AUM is provided in the protective film, and the bonding wire BW containing, for example, Cu, is coupled to the Au plated film AUM in the opening OP. A portion of the Au plated film AUM, the portion being exposed from the opening OP, serves as a bonding pad BP.

Figure 4:
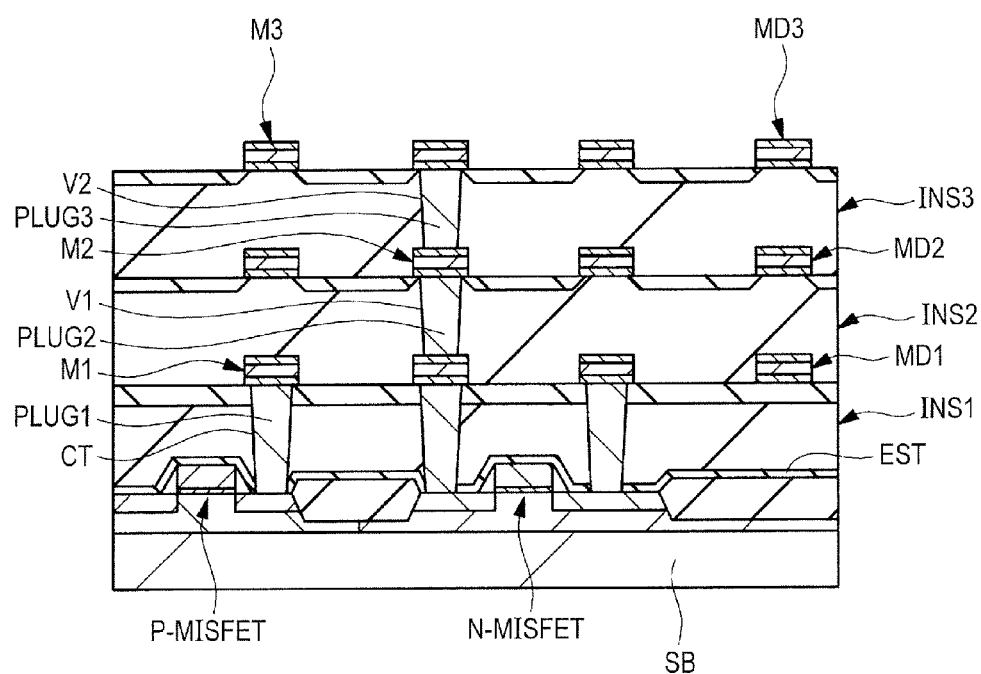
FIG. 4 is a sectional view of a substantial part of the semiconductor device of the embodiment, during a manufacturing step.

FIGS. 4 to 12 are sectional views of a substantial part, illustrating a method of manufacturing the semiconductor device SD according to the present embodiment. FIG. 4 is a sectional view of a substantial part at a stage where the formation of the third wiring M3 and the third dummy wiring MD3 has been completed, and a manufacturing method up to this stage will be briefly described. The P-type semiconductor substrate SB is first provided, and the n-type MISFET (N-MISFET) and the p-type MISFET (P-MISFET) are formed over the top surface of the semiconductor substrate SB. Subsequently, the etching stopper film EST and the first interlayer insulating film INS1 are formed over the top surface of the semiconductor substrate SB, and the surface of the first interlayer insulating film INS1 is flattened by performing CMP processing on the first interlayer insulating film INS1. Subsequently, the contact holes CT are opened in the first interlayer insulating film INS1 and the etching stopper film EST, and the conductive first plug electrode PLUG1 is formed in the contact hole CT. The first plug electrode PLUG1 is formed, for example, by: forming a tungsten film in the contact hole CT and over the first interlayer insulating film INS1; and removing the tungsten film over the first interlayer insulating film INS1 by performing CMP processing on the tungsten film such that the tungsten film is selectively left only in the contact hole CT. Subsequently, the first wiring M1 and the first dummy wiring MD1 are formed over the first interlayer insulating film INS1 and the first plug electrode PLUG1. The first wiring M1 and the first dummy wiring MD1 are formed by forming a first layer metal wiring layer and then by performing patterning processing with the use of photolithography, these steps not being illustrated. The first layer metal wiring layer has a laminated structure including, from its lowest layer, Ti, TiN, Al wiring containing Cu, and TiN, the metal film of each layer being formed by a sputtering method.

Subsequently, the second interlayer insulating film INS2 is formed so as to cover the first wiring M1 and the first dummy wiring MD1, and the surface of the second interlayer insulating film INS2 is flattened by performing CMP processing thereon. Subsequently, the first via holes V1 are opened in the second interlayer insulating film INS2, and the conductive second plug electrode PLUG2 is formed in the first via hole V1. The second plug electrode PLUG2 is formed by the same members and in the same way as those in the first plug electrode PLUG1. Accordingly, the second plug electrode PLUG2 is also formed by a tungsten film. Subsequently, the second wiring M2 and the second dummy wiring MD2 are formed over the second interlayer insulating film INS2 and the second plug electrode PLUG2. The second wiring M2 is formed by the same materials and the same structure as those of the first wiring M1.

Subsequently, the third interlayer insulating film INS3 is formed so as to cover the second wiring M2 and the second dummy wiring MD2, and the surface of the third interlayer insulating film INS3 is flattened by performing CMP processing thereon. Subsequently, the second via holes V2 are opened in the third interlayer insulating film INS3, and the conductive third plug electrode PLUG3 is formed in the second via hole V2. The third plug electrode PLUG3 is formed by the same members and in the same way as those in the first plug electrode PLUG1. Accordingly, the third plug electrode PLUG3 is also formed by a tungsten film. Subsequently, the third wiring M3 and the third dummy wiring MD3 are formed over the third interlayer insulating film INS3 and the third plug electrode PLUG3. The third wiring M3 is formed by the same materials and the same structure as those of the second wiring M2.

Figure 5:
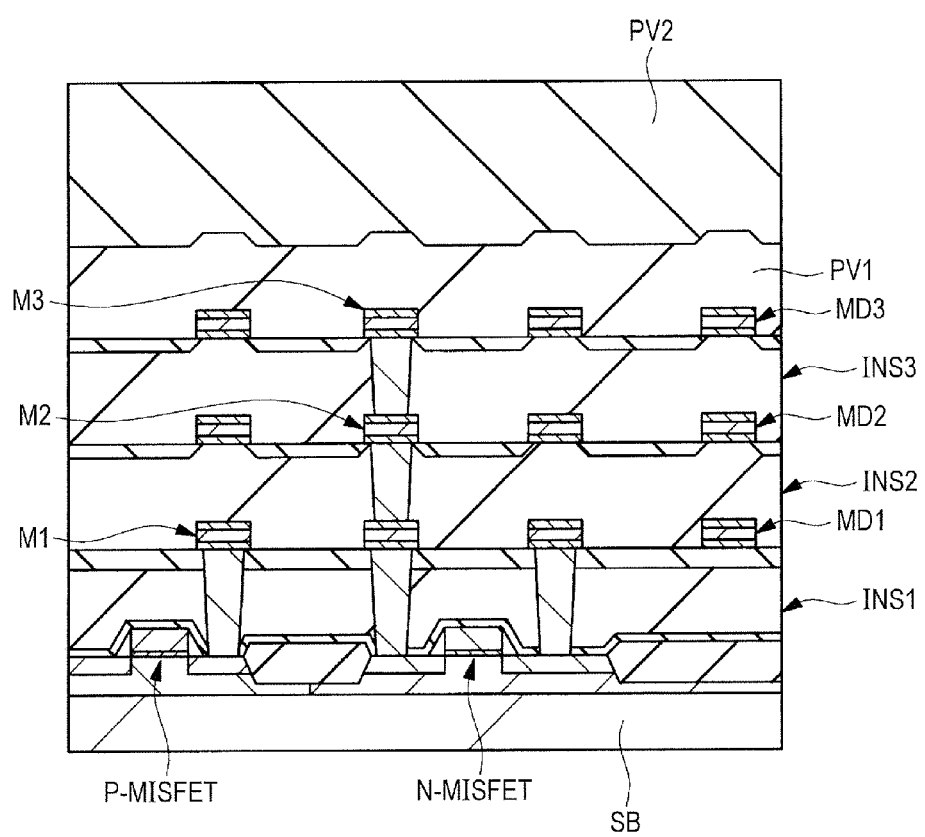
FIG. 5 is a sectional view of a substantial part of the semiconductor device during a manufacturing step following FIG. 4.

Subsequently, an HDP-USG film having a thickness within a range of 500 nm to 2000 nm is formed, as the first passivation film PV1, so as to cover the third wiring M3 and the third dummy wiring MD3, as illustrated in FIG. 5. It is desirable to make the thickness of the HDP-USG film to be larger than or equal to that of the third wiring M3, thereby allowing a difference between the thickness of the HDP-USG film over the third wiring M3 and that of the HDP-USG film between two of the third wiring M3 to be made small. That is, as the thickness of the HDP-USG film is increased, a step over the surface of the HDP-USG film can be reduced; however, if the thickness thereof is made too large, an adverse effect, in which a crack occurs in the HDP-USG film itself, etc., is generated, and hence it is desirable to make the thickness thereof to be 2000 nm or less. Herein, the thickness thereof is set to be 500 nm, taking into consideration a time for forming the HDP-USG film.

A TEOS film having a thickness of 1200 nm is formed, as the second passivation film PV2, over the HDP-USG film by using a plasma CVD method. The thickness of the TEOS film is set to be within a range of 1200 nm to 2000 nm, taking into consideration the later-described CMP grinding amount of the TEOS film.

Figure 6:
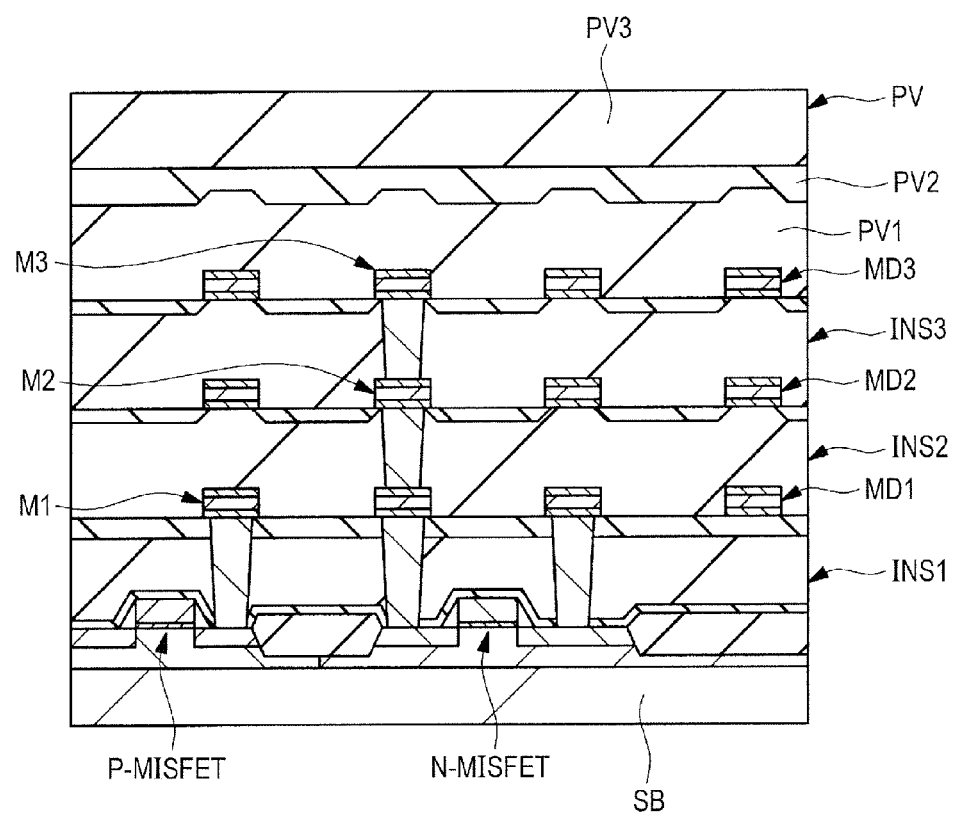
FIG. 6 is a sectional view of a substantial part of the semiconductor device during a manufacturing step following FIG. 5.

Subsequently, the surface of the second passivation film PV2 is flattened with approximately 800 nm of the TEOS film being removed by performing CMP processing on the second passivation film PV2, as illustrated in FIG. 6. It is desirable to set the CMP grinding amount to be approximately 800 nm to 1000 nm, taking into consideration the flatness of the ground surface. As a result, the second passivation film PV2 has a flat surface in which the aforementioned equation: $(d2+d3-d1 \leq d3 \times 20\%)$ is satisfied. Subsequently, the third passivation film PV3, having compressive stress and including a silicon nitride film, is formed over the flat surface of the second passivation film PV2 by a plasma CVD method. The third passivation film PV also has a surface (upper surface) that is as flat as that of the second passivation film PV2. The thickness of the silicon nitride film is set to be within a range of 600 nm to 2000 nm.

Figure 7:
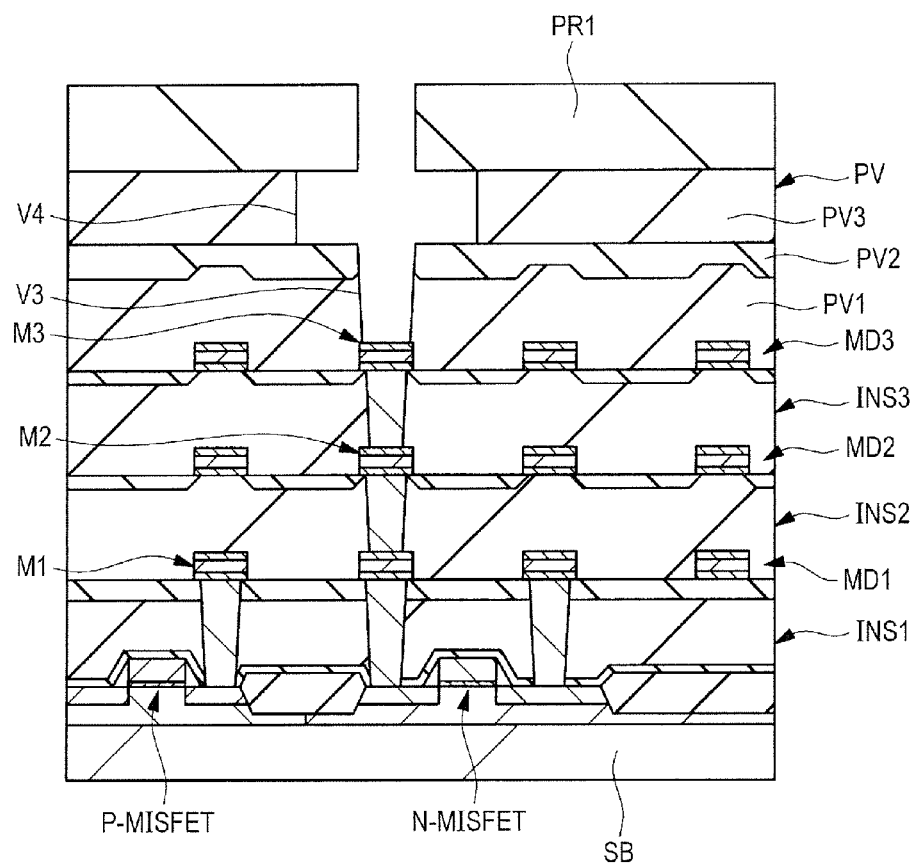
FIG. 7 is a sectional view of a substantial part of the semiconductor device during a manufacturing step following FIG. 6.

Subsequently, a first photoresist film PR1 having a first pattern is formed over the third passivation film PV3, so that the fourth via hole V4 is formed in the third passivation film PV3 and the third via hole V3 is formed in the second passivation film PV2 and the first passivation film PV1 with the use of the first photoresist film PR1 as a mask, as illustrated in FIG. 7. The fourth via hole V4 is formed by performing dry etching on the third passivation film PV3, and thereafter the third via hole V3 is formed by performing dry etching on the second passivation film PV2 and the first passivation film PV1. The opening diameter of the fourth via hole V4 is made larger than that of the third via hole V3. The surface of the third wiring M3 is exposed from the passivation film PV by the fourth via hole V4 and the third via hole V3.

Figure 8:
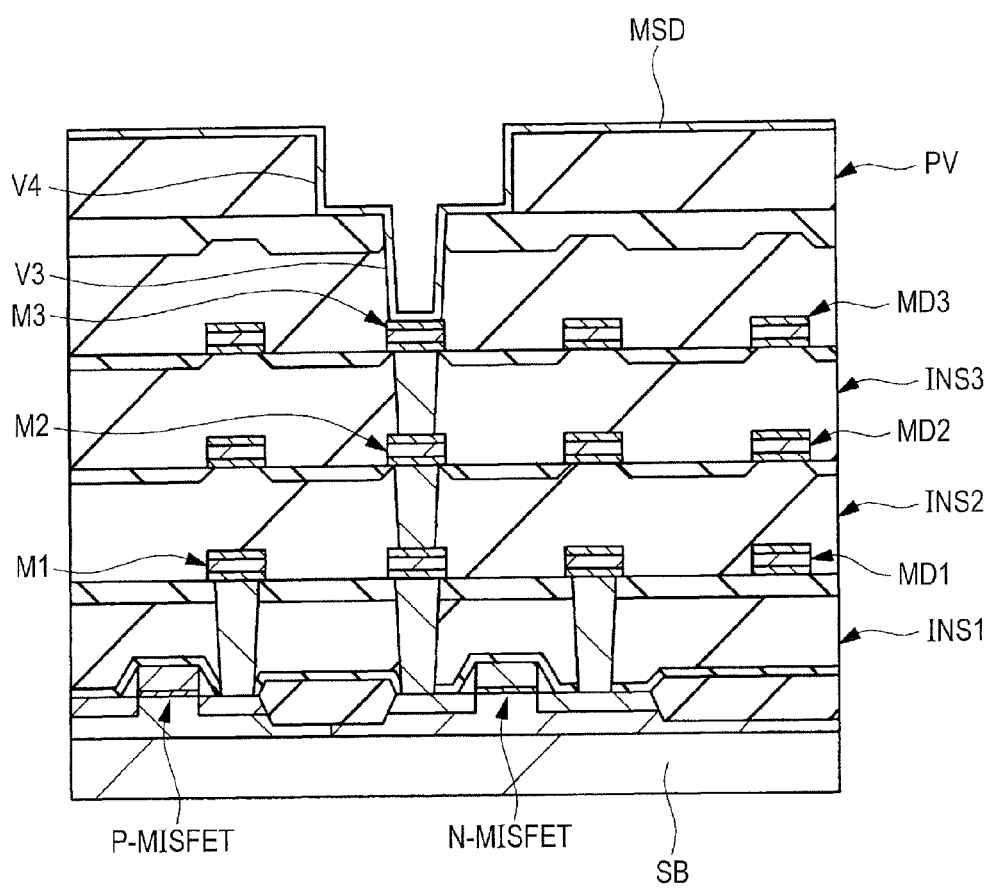
FIG. 8 is a sectional view of a substantial part of the semiconductor device during a manufacturing step following FIG. 7.

Subsequently, the plating seed film MSD is formed over the passivation film PV and along the side walls of the fourth via hole V4 and the third via hole V3, as illustrated in FIG. 8. The plating seed film MSD is a laminated film including a lower Cr film and an upper Cu film, each of which has been formed by a sputtering method. Disconnection in the plating seed film MSD can be reduced by making the diameter of the fourth via hole V4 to be larger than that of the third via hole V3. The plating seed film MSD contacts the third wiring M3 in the third via hole V3 to be electrically coupled.

Figure 9:
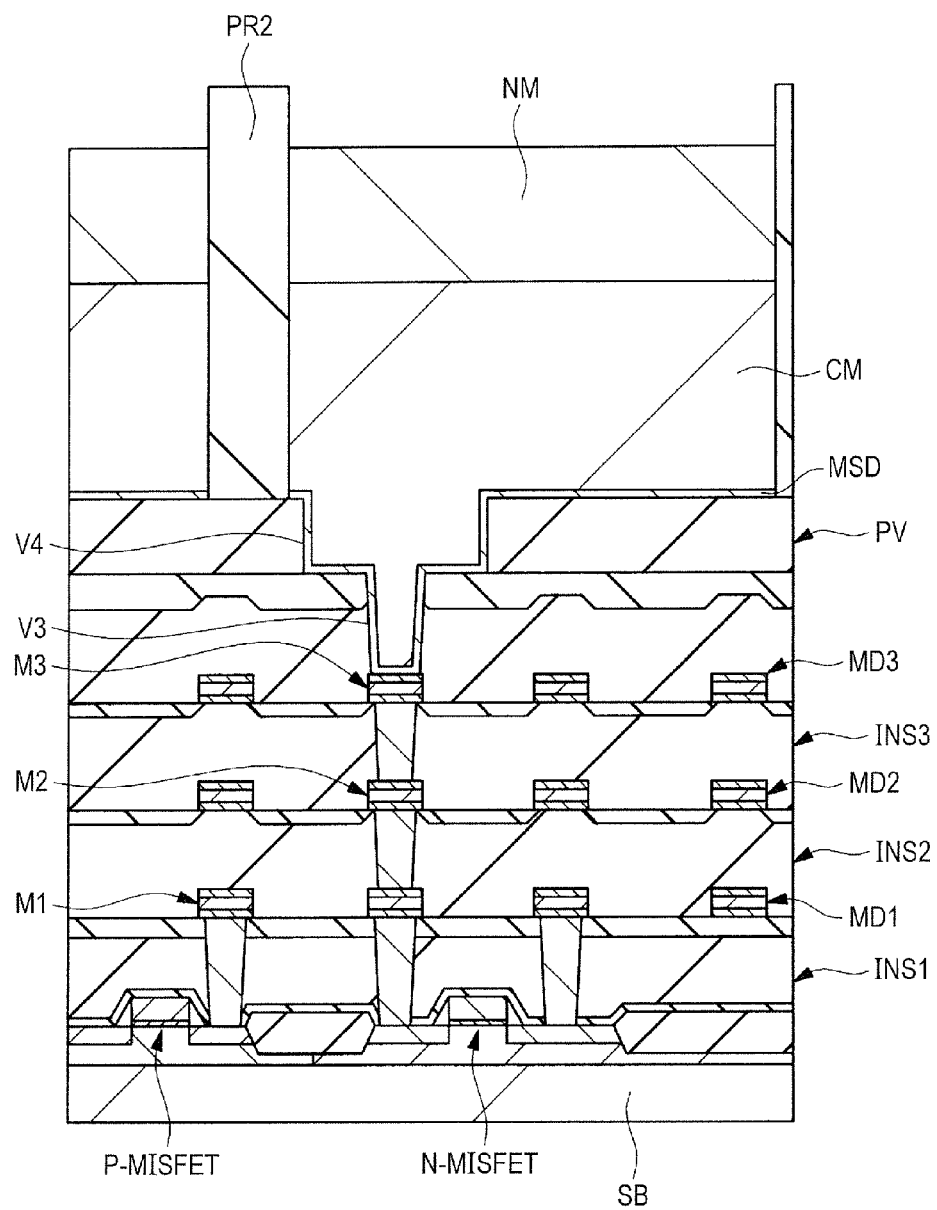
FIG. 9 is a sectional view of a substantial part of the semiconductor device during a manufacturing step following FIG. 8.

Subsequently, a second photoresist film PR2 having a second pattern is formed over the plating seed film MSD, as illustrated in FIG. 9. The second photoresist film PR2 has the second pattern in which a portion where the rewiring layer WM is formed is opened. Subsequently, the Cu plated film CM and the Ni plated film NM are formed in the opening portion of the second photoresist film PR2 by an electrolytic plating method using the plating seed film MSD. The Cu plated film CM is also formed in the third via hole V3 and in the fourth via hole V4.

Figure 10:
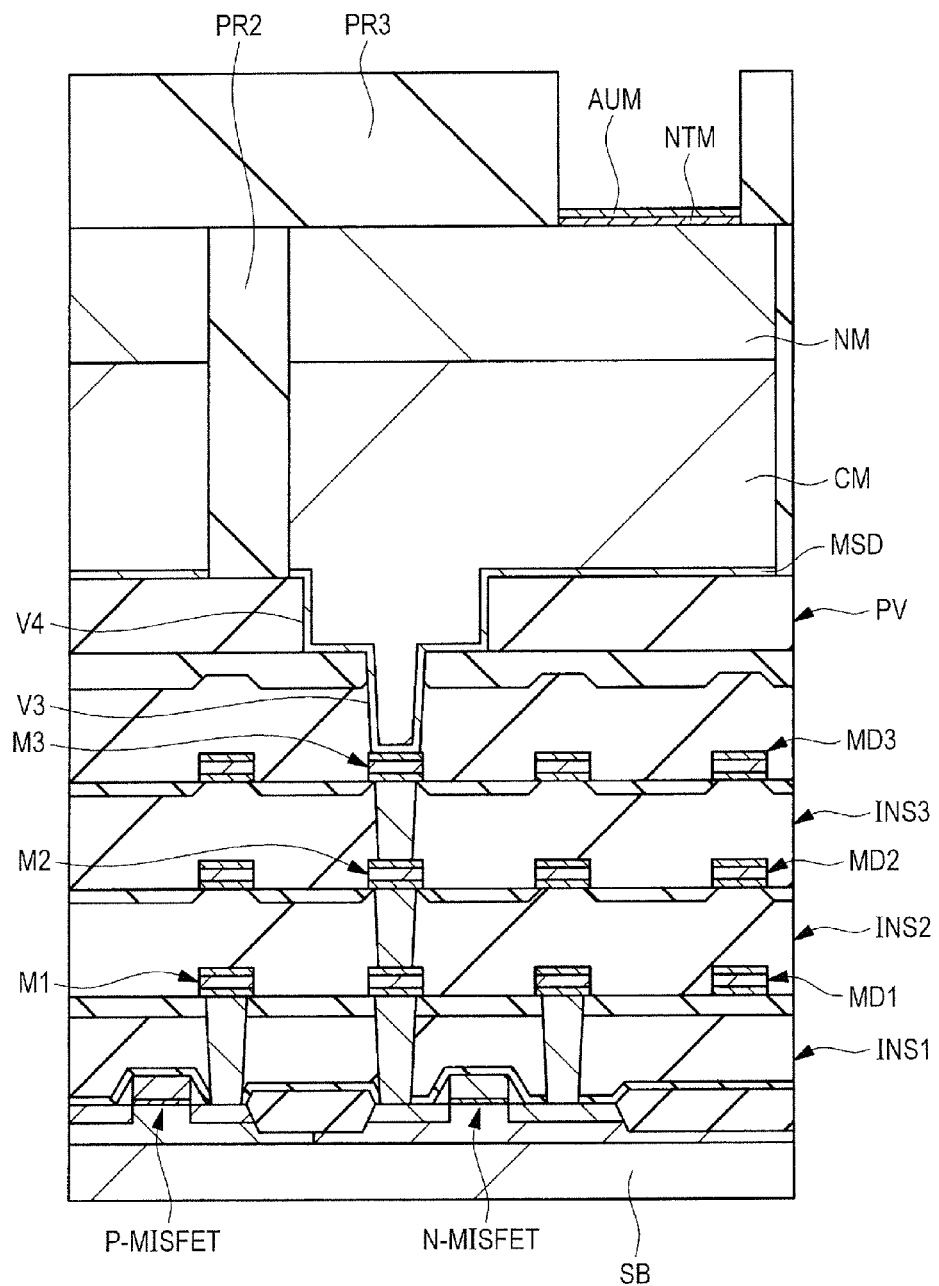
FIG. 10 is a sectional view of a substantial part of the semiconductor device during a manufacturing step following FIG. 9.

Subsequently, a third photoresist film PR3 having a third pattern is formed over the second photoresist film PR2 and the Ni plated film NM, as illustrated in FIG. 10. The third photoresist film PR3 has the third pattern in which a portion where the bonding pad is formed is opened. Subsequently, the Ni plated thin film NTM and the Au plated film AUM are sequentially formed in the opening portion of the third photoresist film PR3 by an electrolytic plating method using the plating seed film MSD.

Figure 11:
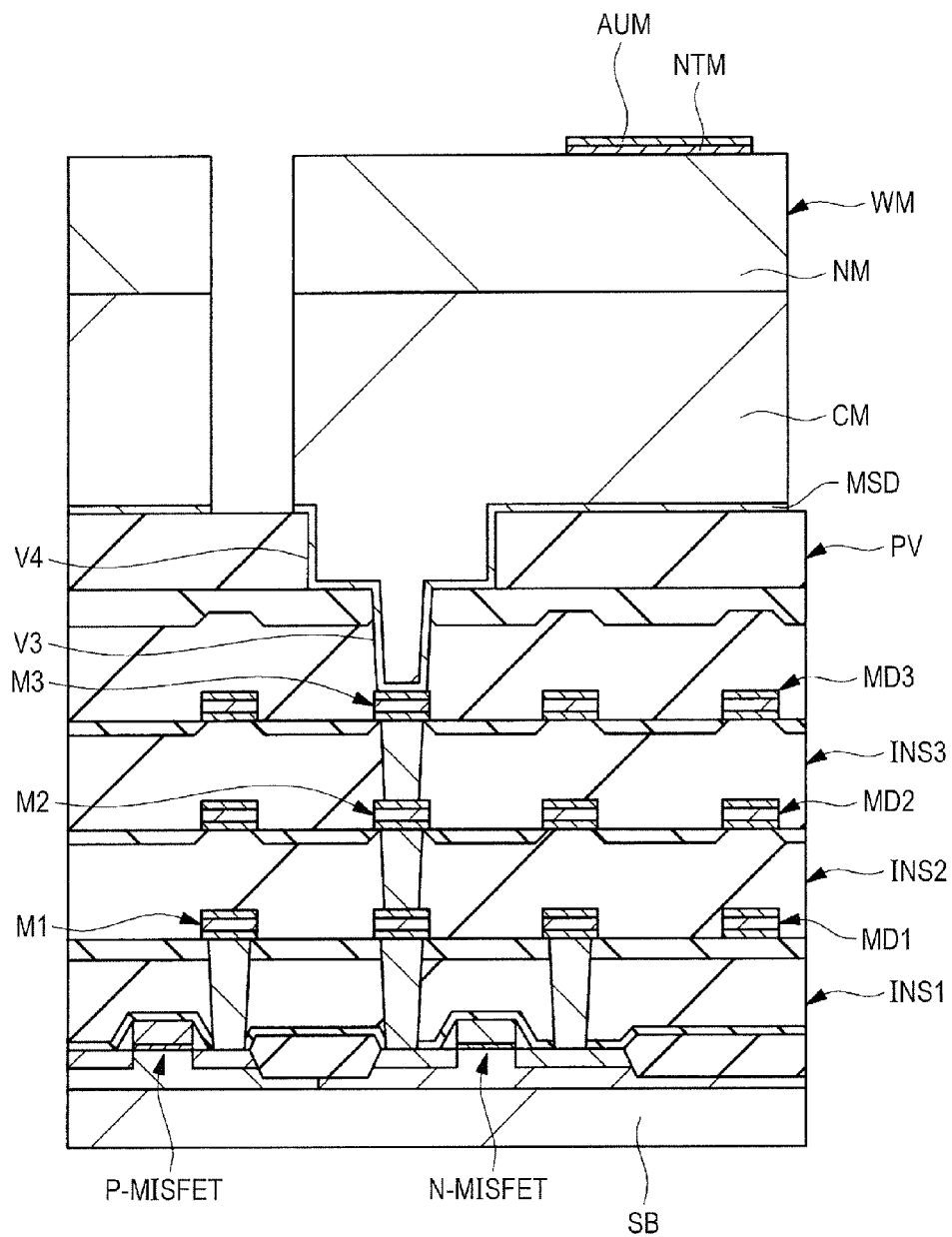
FIG. 11 is a sectional view of a substantial part of the semiconductor device during a manufacturing step following FIG. 10.

Subsequently, the third photoresist film PR3 and the second photoresist film PR2 are removed, as illustrated in FIG. 11. Subsequently, by removing, with wet etching, the plating seed film MSD in a region covered with the second photoresist film PR2, i.e., in a region where the Cu plated film CM and the Ni plated film NM are not present, the rewiring layer WM including a laminated structure of the plating seed film MSD, the Cu plated film CM, and the Ni plated film NM, can be formed.

Figure 12:
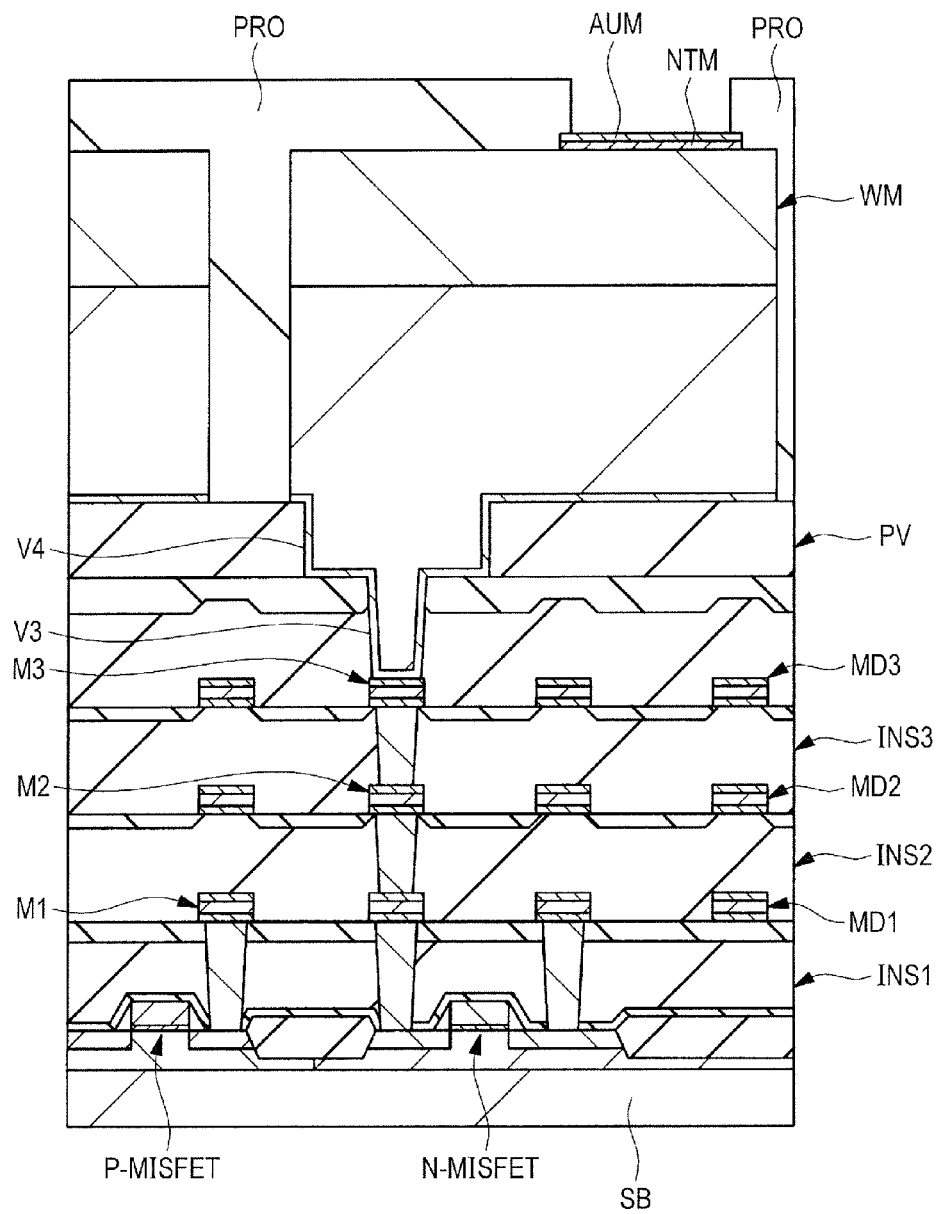
FIG. 12 is a sectional view of a substantial part of the semiconductor device during a manufacturing step following FIG. 11.

Subsequently, the protective film PRO including a polyimide film is formed so as to cover the upper surface of the passivation film PV, the upper surface and the side surface of the rewiring layer WM, and the upper surface and the side surfaces of the Ni plated thin film NTM and the Au plated film AUM, as illustrated in FIG. 12. An opening is formed in a region of the protective film PRO, in which the bonding pad BP is formed, and the upper surface of the Au plated film AUM is exposed from the protective film PRO. The semiconductor device SD is completed through the aforementioned steps.

Figure 13:
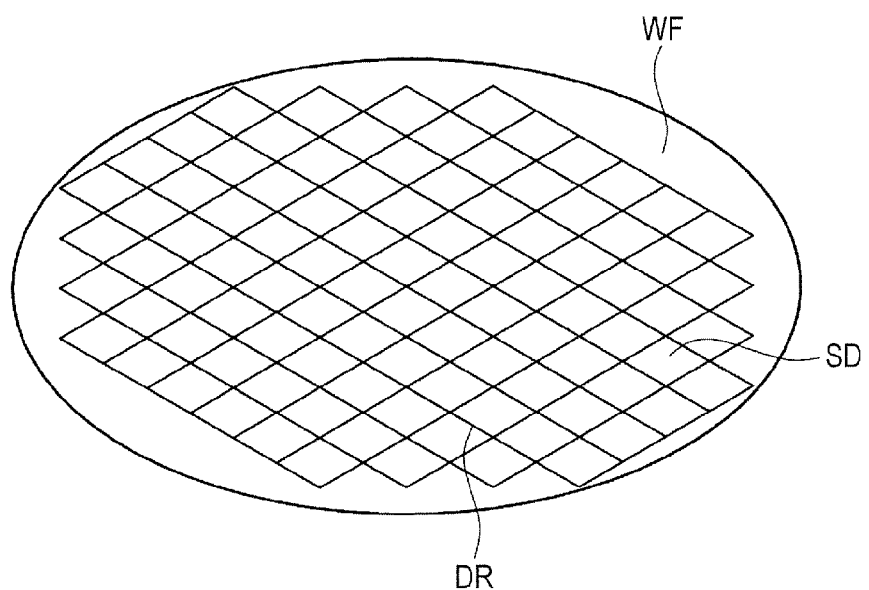
FIG. 13 is a plan view illustrating a wafer of the semiconductor device of the embodiment.

FIG. 13 is a plan view illustrating a wafer directed to the semiconductor device SD of the present embodiment. As illustrated in FIG. 13, a plurality of the semiconductor devices SD are formed to be arranged in a matrix pattern over the top surface (major surface) of a wafer WF, and dicing regions DR are provided in a lattice pattern between the semiconductor devices SD. The thickness of the wafer WF used in the manufacturing steps described with reference to FIGS. 4 to 12 is approximately 775 µm in the case where the diameter of the wafer WF is 300 mm.

Figure 14:
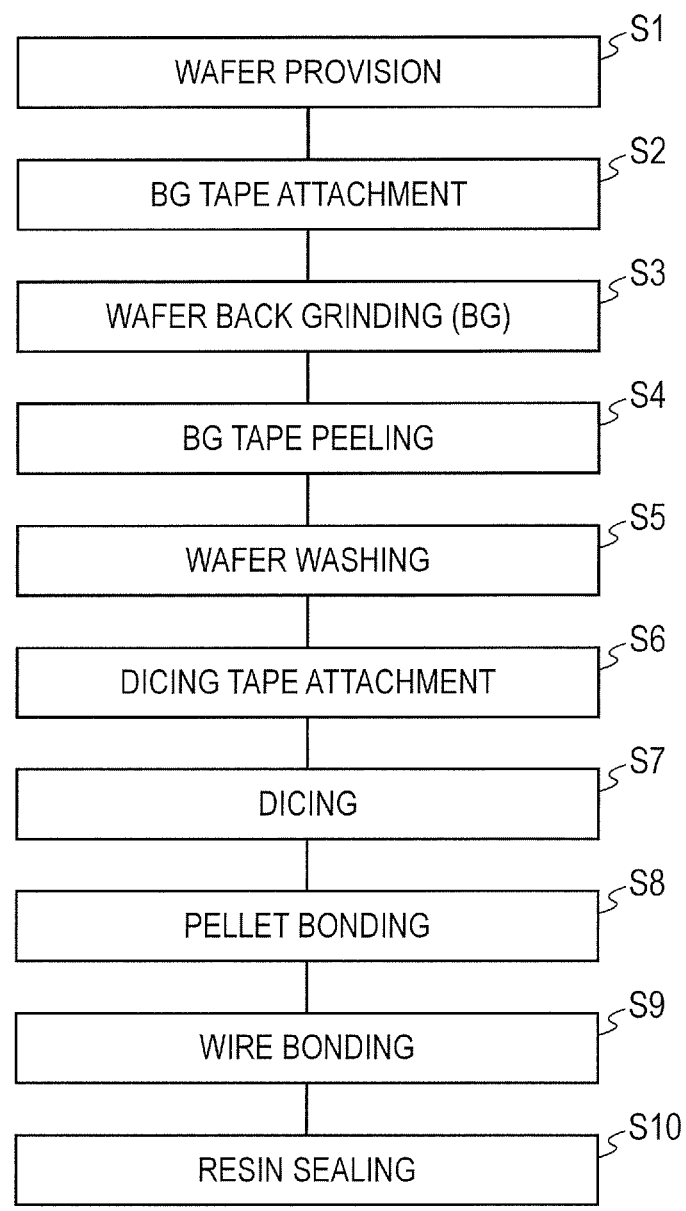
FIG. 14 is a process flow chart showing a mounting method of the semiconductor device of the embodiment.

FIG. 14 is a process flow showing a mounting method of the semiconductor device SD. In other words, it is a process flow chart showing manufacturing steps of the sealed type semiconductor device SD. Hereinafter, a mounting method of the semiconductor device SD will be described with reference to FIG. 14. In Step S1, the wafer WF, over which the semiconductor devices SD manufactured by the manufacturing method described with reference to aforementioned FIGS. 4 to 12 are arranged, is provided. In this stage, the wafer WF has a thickness of approximately 775 µm in the case where the diameter thereof is, for example, 300 mmφ. In Step S2, a back grinding (BG) tape (supporting member) formed by a resin film is attached to the major surface of the wafer WF in order to protect the major surface thereof in the subsequent wafer BG step. In Step S3, the thickness of the wafer WF is reduced, for example, to approximately 300 mm by grinding the back surface of the wafer WF with a whetstone while the BG tape is being attached to the major surface thereof. In Step S4, the BG tape is peeled from the wafer WF whose thickness has been reduced. In Step S5, the wafer WF whose thickness has been reduced is washed. This step is performed to remove, for example, the adhesive of the BG tape adhered to the top surface of the wafer WF and grinding sludge adhered to the wafer WF in the wafer BG step, etc. In Step S6, the back surface side of the wafer WF whose thickness has been reduced is attached to a dicing tape (supporting member) formed by a resin film. It is desirable to interpose a tape-shaped adhesive layer, which will serve as an adhesive when the later-described pellet bonding is performed, between the back surface of the wafer WF and the dicing tape. In Step S7, the wafer WF is diced by running a dicing blade along the dicing regions DR arranged in a lattice pattern over the top surface of the wafer WF. The semiconductor devices SD formed over the major surface of the wafer WF are divided into individual semiconductor devices SD by this dicing. Also in this dicing, the tape-shaped adhesive layer arranged over the back surface of the wafer WF is simultaneously cut. Step S8 is a die bonding step in which the semiconductor device SD and the adhesive layer, which have been individually divided, are mounted, for example, over the die pad DP in FIG. 2 to be adhered thereto. Step S9 is a wire bonding step in which the bonding pad BP in the semiconductor device SD and the lead terminal LT in FIG. 2 are coupled together by the bonding wire BW containing, for example, Cu. Step S10 is a resin sealing step in which the semiconductor device SD, the bonding wire BW, the die pad DP, and the lead terminals LT are sealed, for example, by an epoxy resin, as illustrated in FIG. 2. A sealed type semiconductor device is completed through the aforementioned steps.

Subsequently, the developments in which the present embodiment has been adopted and the main features and advantages of the embodiment will be described.

The present inventors have studied how to improve the operation speed and the performance of the semiconductor device SD by using a rewiring layer as wiring. As a result, it is revealed that a high-density arrangement of a rewiring layer is difficult in a structure in which a polyimide resin film is provided under the rewiring layer, as described, for example, in Patent Document 1. This is because the thickness of the polyimide resin film is very larger than that of an inorganic insulating film, such as a silicon oxide film or a silicon nitride film. The diameter of an opening provided, for example, in the polyimide film becomes larger than that provided in the inorganic insulating film. In addition, when disconnection in a plating seed film formed over the side wall of the polyimide film in the opening is taken into consideration, the shape of the opening has a structure in which the side wall of the polyimide resin film is inclined. When an end portion of the rewiring layer is overlapped with the inclined portion, it becomes difficult to control the size of the rewiring layer in patterning the rewiring layer, and hence the end portion of the rewiring layer has a shape to completely cover the inclined portion in order not to overlap the inclined portion of the polyimide resin film. Although it may be a partial reason, it has been revealed that a high-density arrangement of a rewiring layer is hampered by these factors. Accordingly, the inventors have studied to eliminate a polyimide film under a rewiring layer.

Figure 15:
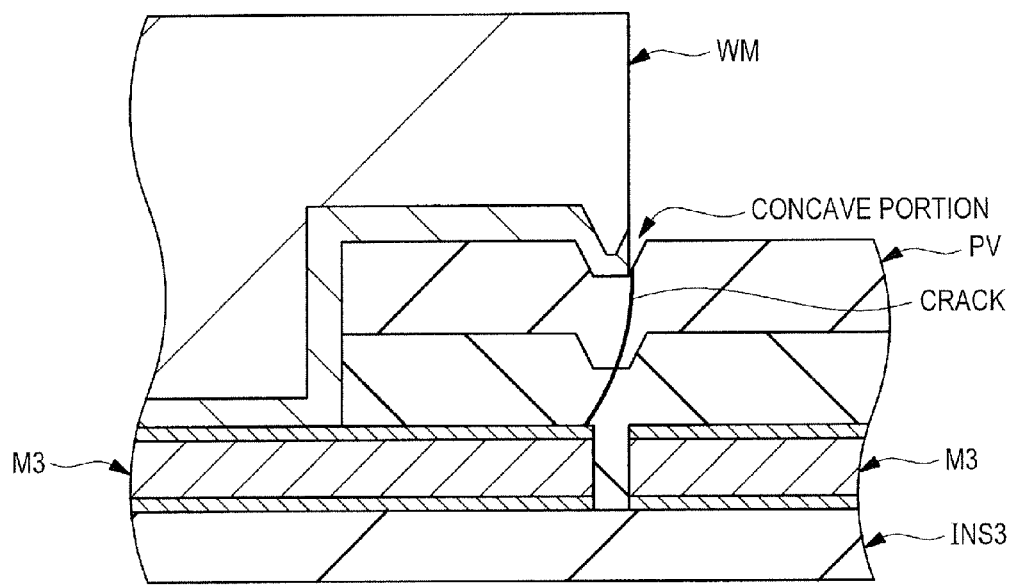
FIG. 15 is a sectional view of a substantial part, illustrating a technical challenge in a semiconductor device of an embodiment.

FIG. 15 is a view illustrating a technical challenge occurring when a polyimide film under a rewiring layer is eliminated. The layers under the third interlayer insulating film INS3 are omitted for simplification. Two of the third wiring M3, which are adjacent to each other with a predetermined space being provided therebetween, are arranged over the third interlayer insulating film INS3, and the passivation film PV is formed so as to cover the third wiring M3. The passivation film PV includes two layers of a lower silicon oxide film and an upper silicon nitride film, and the rewiring layer WM is formed over the passivation film PV. It has been recognized in the study by the present inventors that there is a challenge that a concave portion is present in the surface of the passivation film PV. It has been revealed that: this concave portion is present in an area where the third wiring M3 is not present; and when an end portion of the rewiring layer WM is overlapped with the concave portion, a crack is generated in the passivation film PV, which decreases the reliability of the semiconductor device SD in terms of moisture resistance. It can be considered that: for example, the shrinkage stress of the rewiring layer WM becomes larger at an end portion of the rewiring layer WM than that occurring at an internal portion thereof; and hence when the end portion thereof is located at the concave portion in the passivation film PV, very large stress is applied to the concave portion, which causes a crack. In order to prevent a crack, it is necessary to adopt a structure in which an end portion of the rewiring layer WM covers a concave portion in the passivation film PV, or a structure in which an end portion thereof does not reach a concave portion therein. The end portion of the third wiring M3 and that of the rewiring layer WM must be spaced apart from each other by a predetermined distance, which becomes a major restriction when the rewiring layer WM is arranged, thereby not allowing a high-density arrangement of the rewiring layer WM to be achieved. It has been revealed that a problem of occurring a crack becomes not only a cause by which the reliability of the semiconductor device SD is decreased but also a cause by which a high-density arrangement of the rewiring layer WM is hampered.

In the present embodiment, the surface of the second passivation film PV2 is flattened by performing CMP processing on the laminated film including both the first passivation film PV1 covering the third wiring M3 and the second passivation film PV2, and then the third passivation film PV3 is formed. And, by adopting a structure in which the rewiring layer WM is formed over the third passivation film PV3, a passivation crack can be prevented from occurring, which can improve the reliability of the semiconductor device SD in terms of moisture resistance. Herein, an example has been described above, in which CMP processing is performed on the laminated film including the first passivation film PV1 and the second passivation film PV2; however, CMP processing may be performed on a single layer of the first passivation film PV1 or the second passivation film PV2.

Further, a structure is adopted, in which the passivation film PV includes inorganic insulating films and the rewiring layer WM is arranged over the passivation film PV. That is, because an organic insulating film is not interposed between the third wiring M3 and the rewiring layer WM, a high-density arrangement of the rewiring layer WM can be achieved, which can improve the operation speed of the semiconductor device SD.

Furthermore, because the third dummy wiring MD3 is arranged in the same layer as that of the third wiring M3, the surface of the passivation film PV is flattened across the entire semiconductor device SD, when viewed planarly; and hence the reliability of the semiconductor device SD can be improved and a high-density arrangement of the rewiring layer WM can be achieved by prevention of a passivation crack.

Subsequently, a further challenge occurring when a high-density arrangement of the rewiring layer WM is achieved, which leads to the present embodiment, and the features and advantages of the embodiment will be described.

When a high-density arrangement of the rewiring layer WM is achieved, a warp is generated in the wafer WF, for example, by the stress associated with the shrinkage of the rewiring layer WM, which causes a problem that handling of the wafer WF becomes difficult, for example, in the steps following Step S4 in FIG. 14. This is because: the thickness of the wafer WF is reduced from originally 775 µm to 300 µm in the wafer back grinding step in FIG. 14, as described above, and hence a warp of the wafer WF becomes large by the shrinkage stress of the rewiring layer WF. For example, in the wafer washing step of Step S5 and the dicing tape attaching step of Step S6 in FIG. 14, operations are performed, in which the wafer WF whose thickness has been reduced is transported by being vacuum-adsorbed and held with vacuum tweezers or a vacuum pad. However, when a warp of the wafer WF becomes large, it becomes difficult to vacuum-adsorb and hold the wafer. It has also been revealed that, when the wafer WF whose thickness has been reduced is warped, the aforementioned passivation crack is generated.

In the present embodiment, the third passivation film PV3, having moisture resistance higher than that of the second passivation film PV2, is formed over the second passivation film having a flat surface on which CMP processing has been performed. Further, the steps following Step S4 in FIG. 14 are performed by using the wafer WF having a structure in which the rewiring layer WM is provided over the third passivation film PV3, and hence a passivation crack is not generated even in the wafer WF whose thickness has been reduced, which can improve the reliability of the semiconductor device SD.

In the present embodiment, the steps following Step S4 in FIG. 14 are performed by using the wafer WF having a structure in which: the third passivation film PV3 including a silicon nitride film is formed over the second passivation film having a flat surface on which CMP processing has been performed; and the rewiring layer WM is provided over the third passivation film PV3, and hence a warp can be reduced even after the thickness of the wafer WF is reduced, which can make the handling of the wafer possible. It is desirable that the silicon nitride film that forms the third passivation film PV3 has compressive stress of 500 MPa to 1 GPa and a thickness of 600 nm or more. Because the stress of the silicon nitride film that forms the third passivation film PV3 is oriented in a direction opposite to that of the stress applied to the semiconductor substrate SB, the latter stress being generated by the shrinkage of the rewiring layer WM, a warp can be prevented even after the thickness of the wafer WF is reduced. Further, the silicon nitride film that forms the third passivation film PV3 has a coefficient of linear expansion almost the same as that of the semiconductor substrate SB containing silicon, and hence a warp can be prevented even after the thickness of the wafer WF is reduced. Incidentally, the coefficient of linear expansion ($\times 10^{-6}/°$ C.) of silicon is 2.6, that of the silicon nitride film is 3.0, that of Cu is 16.8, and that of Ni is 12.8. That is, although the wafer WF including silicon having a thickness of 775 µm is ground to a thickness of 300 µm in the wafer back grinding step of Step S3 in FIG. 14, the wafer WF whose thickness has been reduced can be prevented from being greatly warped by forming the aforementioned silicon nitride film as part of the passivation film PV.

Figure 16:
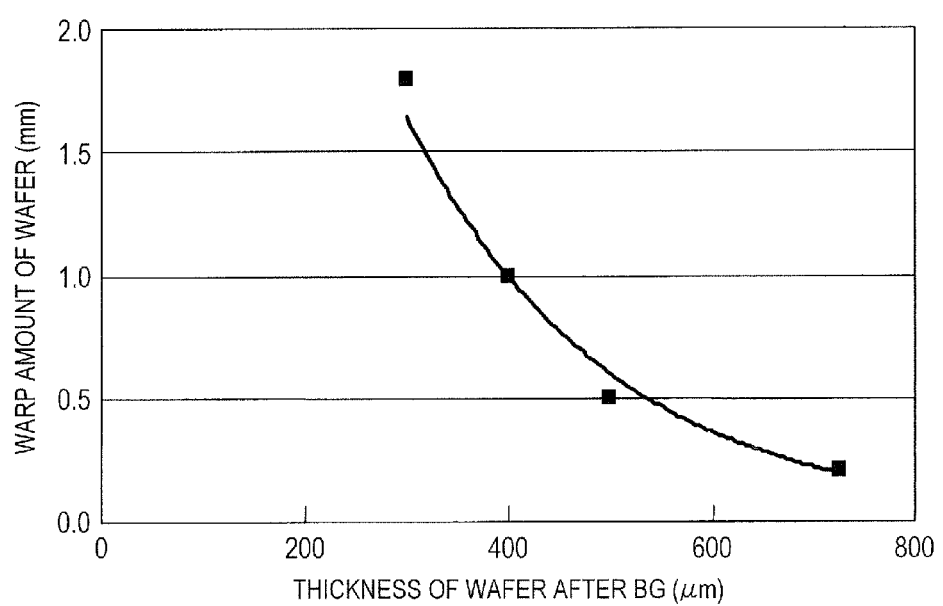
FIG. 16 is a graph showing a relationship between a thickness of the wafer and a warp amount of the wafer directed to the semiconductor device of the embodiment.

FIG. 16 is a graph showing a relationship between a thickness of the wafer and a warp amount of the wafer, the wafer being directed to the semiconductor device SD of the present embodiment and having been subjected to the back grinding. Herein, the semiconductor device SD has the structure illustrated in FIG. 3, and a silicon nitride film, having compressive stress of 500 MPa and a thickness of 600 nm, is used as the third passivation film PV3. It has been verified that, even when the thickness of the wafer WF is 300 µm after being subjected to the back grinding, a warp amount of the wafer WF is 2.0 mm or less that is within a range in which handing is possible.

(Second Embodiment)

The present Second Embodiment corresponds to a variation of the aforementioned First Embodiment.

With reference to FIG. 4, it has been described that the third wiring M3 and the second wiring M2 are formed to include the same members and the same structure as those of the first wiring M1. That is, the third wiring M3 has a laminated structure including, from its lowest layer, Ti, TiN, Al wiring containing Cu, and TiN, the metal film of each layer being formed by a sputtering method.

In the present Second Embodiment, the TiN film located in the upper layer of the aluminum wiring is formed by a high directional sputtering method. As the high directional sputtering method, a publicly-known long throw sputtering method or a collimated sputtering method is used. Because a TiN film formed by such a method has internal stress higher than that of a film formed by a normal sputtering method, an advantage of reducing a warp of the wafer WF can be obtained.

With reference to FIG. 8, it has been described that the plating seed film MSD includes a laminated film of the lower Cr film and the upper Cu film. In the present Second Embodiment, a TiN film formed by a high directional sputtering method may be used instead of the lower Cr film. An advantage of further reducing a warp of the wafer WF can be obtained by the internal stress that the TiN film has.

An example, in which the TiN film located in the upper layer of the Al wiring is formed by a high directional sputtering method, and an example, in which a TiN film formed by a high directional sputtering method is formed in part of the plating seed film MSD, may be applied simultaneously.

The invention made by the present inventors has been specifically described above based on its preferred embodiments; however, the invention should not be limited to the embodiments, and it is needless to say that the invention may be modified variously within a range not departing from the gist thereof.

What is claimed is:

1. A semiconductor device comprising:
   a semiconductor substrate;
   a first insulating film formed over the semiconductor substrate;
   a plurality of first wiring having a first thickness formed over the first insulating film;
   a second insulating film that includes an inorganic insulating film covering the first wiring and that has a flat surface on which CMP processing has been performed;
   a third insulating film including an inorganic insulating film formed over the flat surface of the second insulating film; and
   a plurality of second wiring having a second thickness formed over the third insulating film,
   wherein the third insulating film has moisture resistance higher than that of the second insulating film,
   wherein the second thickness is 10 times or more larger than the first thickness,
   wherein the second wiring is located over the third insulating film without an organic insulating film being interposed between itself and the third insulating film, and
   wherein the thickness of the second insulating film in a region between two of the first wiring is almost equal to the total of the thickness of the second insulating film over the first wiring and the first thickness.

2. The semiconductor device according to claim 1, wherein, when it is assumed that: the thickness of the second insulating film in a region between two of the first wiring is $d1$; the thickness of the second insulating film over the first wiring is $d2$; and the first thickness is $d3$, the equation: $d2+d3-d1 \leq d3 \times 20\%$ is satisfied.

3. The semiconductor device according to claim 1, wherein the third insulating film has stress oriented in a direction opposite to that of stress applied to the semiconductor substrate, the latter stress being generated by shrinkage of the second wiring.

4. The semiconductor device according to claim 3, wherein the third insulating film has compressive stress.

5. The semiconductor device according to claim 4, wherein the third insulating film includes a silicon nitride film having a thickness ($t2$) of $600$ nm $\leq t2 \leq 2000$ nm.

6. The semiconductor device according to claim 3, wherein the third insulating film includes a silicon nitride film, while the second wiring includes a Cu film.

7. The semiconductor device according to claim 6, wherein the second wiring includes a laminated film of a Cu film and a Ni film.

8. The semiconductor device according to claim 6, wherein a bonding wire is coupled to the second wiring.

\* \* \* \* \*